(12) United States Patent
Naito et al.

(10) Patent No.: US 8,367,573 B2
(45) Date of Patent: *Feb. 5, 2013

(54) GLASS COMPOSITION AND ITS APPLICATIONS

(75) Inventors: Takashi Naito, Funabashi (JP); Shinichi Tachizono, Narita (JP); Kei Yoshimura, Inba (JP); Hiroki Yamamoto, Hitachi (JP); Hiroshi Yoshida, Mito (JP); Shinji Yamada, Tsukuba (JP); Katsumi Mabuchi, Hitachi (JP)

(73) Assignee: Hitachi Powdered Metals Co., Ltd., Chiba (JP)

( * ) Notice: Subject to any disclaimer, the term of this patent is extended or adjusted under 35 U.S.C. 154(b) by 891 days.

This patent is subject to a terminal disclaimer.

(21) Appl. No.: 12/366,829

(22) Filed: Feb. 6, 2009

(65) Prior Publication Data

US 2009/0199897 A1     Aug. 13, 2009

(30) Foreign Application Priority Data

Feb. 8, 2008   (JP) ................. 2008-028294
Oct. 17, 2008  (JP) ................. 2008-268074

(51) Int. Cl.
  *C03C 3/21*   (2006.01)
  *C03C 8/00*   (2006.01)
  *C03C 8/14*   (2006.01)
  *C03C 8/08*   (2006.01)

(52) U.S. Cl. ............... 501/46; 501/14; 501/17; 501/24; 501/15; 501/21; 501/45; 136/256; 252/512; 252/514; 174/126.4; 428/426

(58) Field of Classification Search ............. 501/17, 501/21, 24, 45, 46, 14, 15; 136/256; 252/512, 252/514; 174/126.4; 428/426
See application file for complete search history.

(56) References Cited

U.S. PATENT DOCUMENTS

| | | | |
|---|---|---|---|
| 3,901,718 A * | 8/1975 | Wu ............................... 501/46 |
| 6,998,776 B2 * | 2/2006 | Aitken et al. ................ 313/512 |
| 8,075,961 B2 * | 12/2011 | Sawai et al. ................... 428/1.5 |
| 2006/0003883 A1 * | 1/2006 | Yoshida et al. .................. 501/46 |
| 2006/0290261 A1 * | 12/2006 | Sawai et al. .................. 313/495 |
| 2007/0158021 A1 * | 7/2007 | Sawai et al. .................. 156/285 |
| 2008/0238315 A1 * | 10/2008 | Hojo et al. ..................... 313/582 |
| 2008/0238316 A1 | 10/2008 | Hayashibara et al. |
| 2008/0238821 A1 * | 10/2008 | Miyata et al. ................... 345/60 |
| 2010/0180934 A1 * | 7/2010 | Naito et al. ..................... 136/252 |

FOREIGN PATENT DOCUMENTS

| | | |
|---|---|---|
| JP | 04-132634 | 5/1992 |
| JP | 07-069672 | 3/1995 |
| JP | 07-112934 | 12/1995 |
| JP | 10-139478 | 5/1998 |
| JP | 2004-250276 | 9/2004 |
| JP | 2006-342044 | 12/2006 |
| JP | 2006-347839 | 12/2006 |
| JP | 2006-347840 | 12/2006 |
| JP | 2007-022853 | 2/2007 |
| JP | 2007-182347 | 7/2007 |
| JP | 2007-320822 | 12/2007 |
| JP | 2007-320823 | 12/2007 |
| JP | 2008-053026 | 3/2008 |
| JP | 2008-251325 | 10/2008 |
| KR | 2006-116171 | 11/2006 |

OTHER PUBLICATIONS

Korean Office Action with partial translation.

* cited by examiner

*Primary Examiner* — Karl Group
*Assistant Examiner* — Elizabeth A Bolden
(74) *Attorney, Agent, or Firm* — Antonelli, Terry, Stout & Kraus, LLP.

(57) ABSTRACT

A glass composition substantially free from lead and bismuth and containing vanadium oxide and phosphor oxide as main ingredients, wherein the sintered glass of the glass composition exhibits $10^9$ Ωcm or more at 25° C.

37 Claims, 5 Drawing Sheets

GLASS COMPOSITION AND ITS APPLICATIONS

CLAIM OF PRIORITY

The present application claims priority from Japanese patent applications Serial No. 2008-28294, filed on Feb. 8, 2008 and Serial No. 2008-268074, filed on Oct. 17, 2008, the contents of which are hereby incorporated by reference into this application.

FIELD OF THE INVENTION

The present invention relates to a glass composition free from lead and bismuth, which is suitable for bonding and sealing various parts at low temperatures. The present invention also relates to a sealing material, wiring material, structural material, optical black material, display device, sheathed heater and solar cell that use the glass composition.

RELATED ART

In image display devices such as plasma display panels (PDP) wherein a front plate and a rear plate are airtightly sealed, a glass composition that melts at low temperatures is used for sealing the front side plate and rear side plate. As the glass composition, a sealing material in which a filler is mixed in glass whose dominant component is lead oxide has heretofore been used.

Recently, use of materials containing lead has been avoided because of restrictions on environment and safety. As glass compositions free from lead, a glass composition whose dominant component is bismuth oxide was proposed by Japanese patent laid-open H10-139478 (patent document No. 1); a glass composition whose dominant component was tin oxide was proposed by Japanese patent laid-open H7-69672 (patent document No. 2); glass compositions whose dominant component was vanadium oxide were proposed by Japanese patent laid-opens 2004-250276 (Patent document No. 3) and 2006-342044 Patent document No. 4).

Patent document No. 1: Japanese patent laid-open H10-139478
Patent document No. 2: Japanese patent laid-open H7-69672
Patent document No. 3: Japanese patent laid-open 2004-250276
Patent document No. 4: Japanese patent laid-open 2006-342044

Sealing materials or bonding materials containing lead oxide as a dominant component and a filler, which softens at low temperatures have been applied for display devices. In recent years, materials that contain lead are being regulated from the viewpoint of environment and safety.

Glass materials containing lead that softens at low temperature, which are called a low softening glass material, have been applied widely for sealing of electronic devices as well as bonding of various products. Glass compositions free from lead and softening at low temperatures are demanded in various fields of products. This glass is called a low softening point glass composition free from lead wherever appropriate.

The low softening point glass compositions free lead have problems from the practical point of view. The low softening point, no lead glass composition containing bismuth as a dominant component has relatively higher sealing temperature than that of glass composition containing lead. Accordingly, the glass composition containing bismuth is not suitable for electronic devices having parts with low heat resistance. Further, bismuth which is mined as a by-product of lead mining in a small amount is more expensive than lead. In addition, in order to produce bismuth, a large amount of lead must be released in the environment so that it gives adverse affects on environment and safety. Since the bismuth containing glass composition tends to be easily reduced, heating in oxygen free atmosphere or low oxygen content atmosphere changes resistivity of the glass composition.

Glass compositions, which are free from lead oxide or bismuth oxide but contain tin oxide as a dominant component are poor in water resistance. A sealing process of electronic devices such as display devices may be conducted simultaneously with sintering or calcining of water containing component such as a fluorescent material. Water in the material evaporates to cause the tin oxide containing glass composition to be corroded, which lowers reliability of the sealing portion. It is said that when the tin oxide containing glass composition is heated in an oxidizing atmosphere such as air, SnO constituting a glass skeleton is oxidized to produce $SnO_2$.

The glass composition free from lead oxide and bismuth oxide but containing vanadium oxide as a dominant component has such a problem that reaction between metal such as silver or copper and glass components takes place at the time of heating such as sealing thereby to corrode silver wiring or copper wiring. Sufficient consideration to the interaction between silver wiring or copper wiring and glass compositions has not been made. If the wiring is corroded, it may increase its resistivity or produces bubbles in the sealing. Further, silver thick film wiring or copper thick film wiring used in electronic devices such as plasma display panels uses glass composition as a sintering aid. Therefore, the glass composition containing vanadium oxide could not be used for the electronic devices having silver or copper thick film wiring because of the reaction.

SUMMARY OF THE INVENTION

Since glass compositions containing lead oxide can soften at low temperatures, they have been used widely. As substituents for the lead containing glass, glass compositions containing bismuth have been put into practice. However, since mining of bismuth produces a great amount of lead, bismuth as well as lead is also not favorable to environment.

It is an object of the present invention to provide a glass composition not containing lead and bismuth that can soften at low temperatures, and does not react with metal components in the electronic devices or the glass composition.

As glass compositions for sealing in production of image display devices, the glass composition containing bismuth as the dominant component has a high softening temperature, which needs high temperatures at the time of sealing or bonding. Thus, it is necessary to avoid influence of high temperatures at portions other than sealing points. The bismuth dominant glass composition tends to be reduced in atmosphere for production of the image display devices, which leads to changes of electric resistivity at the sealing positions. The changes of resistivity bring about deviations of product quality.

The glass composition whose dominant component is tin tends to be deteriorated when used for sealing portions. For example, if the tin dominant glass composition is used as a sealing material for manufacturing the image display devices, water generated by sintering or calcining a fluorescent material causes the sealed portions to be corroded to thereby lower air-tightness thereof. When glass compositions containing vanadium or phosphor as main ingredients are brought into contact with silver wiring or copper wiring used in the image display devices, the wires may be corroded, and resistivity of the wires may increase. At the same time, bubbles may be formed in the sealing portions.

Accordingly, it is an object of the present invention to provide a glass composition suitable for sealing image display devices.

The present invention provides a glass composition containing vanadium oxide and phosphor oxide as main components but substantially free from lead and bismuth and having a resistivity of $10^9$ Ωcm or larger at 25° C. The glass composition may contain manganese and barium.

Further, the glass composition may further contain at least one oxide of alkali metals, antimony, tellurium, zinc, silicon, aluminum, niobium and rare earth elements.

According to the present invention, it is possible to provide a glass composition, which is capable of being softened at relatively low and practical temperatures, without containing lead and bismuth. The glass composition can be applied to various products, which meet regulations on environment and safety.

In the present specification, a "glass composition" includes a glass matrix composition that consist essentially of glass forming components and a glass composition comprising the glass matrix and at least one of a filler powder, a pigment powder such as black material powder, and a metal powder.

One aspect of the present invention provides a glass composition being substantially free from lead and bismuth and containing vanadium oxide and phosphor oxide as main components, wherein the sintered glass of the glass composition exhibits $10^9$ Ωcm or more at 25° C.

Another aspect of the present invention provides a sealing body, which comprises the sintered glass composition mentioned above, the sintered glass composition having resistivity of $10^{10}$ Ωcm or more at 25° C.

A still another aspect of the present invention provides a wiring material comprising a metal powder and a glass composition powder defined above.

Another aspect of the present invention provides a structural material comprising the glass composition defined above, and a filler powder, wherein the glass composition is in an amount of 30 to 60% by volume and the filler powder is in an amount of 40 to 70% by volume.

A further aspect of the present invention provides a glass paste comprising the glass composition defined above, a resin binder and a solvent.

A still further aspect of the present invention provides a display device comprising a front side plate carrying an electrode, a rear side plate carrying an electrode and opposed to the front side plate to form a space therebetween, and a sealing portion for air tightly sealing the peripheries of the front side plate and rear side plate, wherein the sealing portion is in contact with at least part of the electrodes, and wherein the sealing portion is a sintered glass composition defined above in an amount of 60 to 85% by volume and a filler in an amount of 15 to 40% by volume.

A still further aspect of the present invention provides a sheathed heater comprising a heat resisting pipe, a refractory powder filled in the pipe, a wire heater buried in the refractory powder, terminals connected to each end of the heater wire, and sealing portions for airtightly sealing each end of the pipe, wherein the sealing portions are made of a sintered glass of the glass composition defined above.

Another aspect of the present invention provides a solar cell comprising a semiconductor substrate having p-type region and n-type region to constitute a pn-junction and a light receiving face and a rear face; a light receiving electrode formed in the light receiving face; an anti-reflection film formed on the light receiving face; and a rear electrode formed on the rear face, wherein the light receiving electrode is a sintered body comprising silver and the glass composition defined above.

Figure 1:
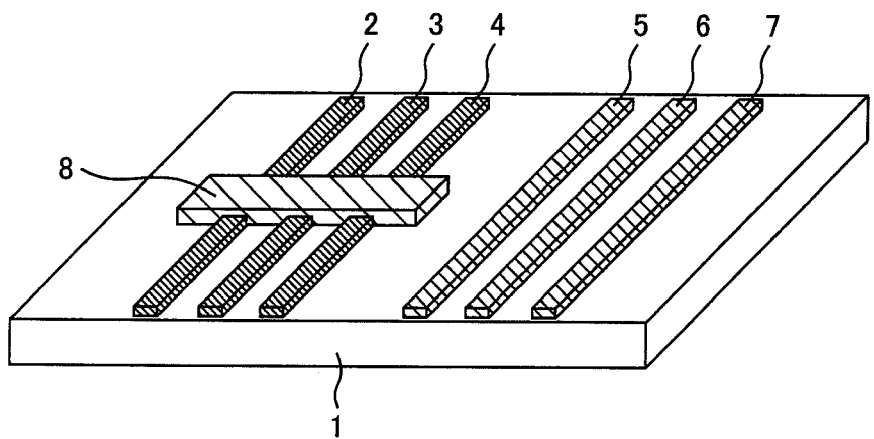
FIG. 1 shows a diagrammatic perspective view of a sample for evaluation of electric resistivity of the glass compositions.

Explanation of reference numerals: 1; glass substrate, 2, 3, 4; thick film silver wires, 5, 6, 7, 8; thick glass films, 10; front side plate, 11; rear side plate, 12; partition wall, 13, 34; sealing material, 14; cell, 15; red fluorescent, 16; green fluorescent, 17; blue fluorescent, 18; display electrode, 19; address electrode, 20; ultraviolet ray, 21; black matrix, 22, 23; dielectric layer, 24; protective layer, 30; U-shaped heat resisting pipe, 31; magnesium oxide powder, 32; heater wire, 33; terminal, 40; semiconductor substrate, 41; diffusion layer, 42; anti-reflection layer, 43; electrode on a light receiving face, 44; collector electrode, 45; power output terminal, 46; electrode diffused layer.

DETAILED DESCRIPTION OF THE PREFERRED EMBODIMENTS

The glass composition according to the present invention can be used as sealing materials, wiring forming glass, structure materials, etc. A preferable composition comprises, on the basis of oxide conversions shown in the brackets by weight, 33 to 45% of vanadium oxide ($V_2O_5$), 22 to 30% of phosphor oxide ($P_2O_5$), 5 to 15% of manganese oxide (MnO), and 10 to 20% of barium oxide (BaO). As alkali metals, Li, Na, K, Rb and Cs are exemplified. Amounts of the alkali metals are, on the basis of $R_2O$ conversion by weight, 0 to 8%, wherein R is alkali metals. It is preferable to contain, on the basis of conversions shown in the brackets, at least one of antimony oxide ($Sb_2O_3$), tellurium oxide ($TeO_2$), zinc oxide (ZnO), silicon oxide ($SiO_2$), aluminum oxide ($Al_2O_3$), niobium oxide ($Nb_2O_5$), and rare earth element oxides ($La_2O_3$; La is rare earth elements) in an amount of 0 to 10% by weight.

A more preferable glass composition comprises, on the basis of oxide conversions by weight, 30 to 45% of vanadium oxide, 22 to 30% of phosphor oxide, 5 to 15% of manganese oxide, 5 to 20% of barium oxide, and 0 to 8%, preferably 3 to 5% of at least one of alkali metal oxides. The glass composition may further contain at least one of antimony oxide, tellurium oxide, zinc oxide, silicon oxide, aluminum oxide, niobium oxide, rare earth element oxides, iron oxide ($Fe_2O_3$), tungsten oxide ($WO_3$) and molybdenum oxide ($MoO_3$) in an amount of 0 to 25%, preferably 4 to 15% by weight.

In using the glass compositions mentioned above for sealing materials, filler powder etc may be added. An amount of the filler is 0 to 40 volume % of the total glass composition. The glass composition other than the filler may preferably have an amount of 60 to 100 volume % and 0 to 40 volume % of the filler.

The filler powder should preferably have an average particle size of 12 to 40 µm. More preferably, the glass composition comprises 10 to 30 volume % of the filler and 90 to 70 volume % of the glass matrix.

If the glass composition is used as the sealing material for the display devices, the sintered glass composition should preferably have resistivity of $10^{10}$ Ωcm or more, and a softening temperature should preferably be 500° C. or lower. Therefore, the glass matrix should preferably have a softening point of 500□ or lower and a resistivity of $10^{10}$ Ωcm or more.

The display devices using the above-mentioned glass composition as the sealing material comprises a front side plate and a rear side plate each having electrode wires formed thereon, wherein the peripheries of the front side plate and rear side plate are sealed air-tightly with the glass composition. Especially, it is preferable to use as the sealing material the glass composition having 60 to 85 volume % of the glass matrix and 15 to 40 volume % of the filler powder. If a metal material such as silver is used as the wiring material mixed with the glass composition, it is possible to form a portion where the metal material is in direct contact with the glass composition.

If the glass composition is used for the display devices of the present invention, it can be used for electrode wiring, partition walls, black layers above the partition walls, black stripes formed in the front side plate, in addition to the sealing.

In addition to the display devices, the glass composition can be used for various applications that need bonding of parts with glass compositions. For example, the glass composition can be used as a sealing material for sealing air-tightly a terminal and a heat resisting pipe of a sheathed heater. The sealing material for the sheathed heater may contain the filler powder wherein the glass matrix is preferably 75 to 100 volume % and the filer powder is preferably 0 to 25 volume %.

If the glass composition is used as a wiring material that contains metal powder, silver or copper is preferably used. Further, aluminum can be used. The filler powder can be added to the wiring composition, wherein the glass matrix powder is preferably 10 to 40 volume %, metal powder is preferably 60 to 90 volume % and the filler powder is preferably 0 to 20 volume %. Using the above wiring material, electrode wiring of plasma display panels, etc can be formed. In addition to the display devices, the wiring material can be applied to electrodes of solar panels etc that contain glass.

The glass composition containing the filler powder can be used as structural materials. The structural materials preferably comprise the glass matrix powder of 30 to 60 volume % and the filler powder of 40 to 70 volume %. The glass composition is used for the partition walls for display devices.

The glass composition according to the present invention can be used for black materials for controlling transmittance and reflection rate of visible light. When the glass composition is used as the optical black material, the filler material and black pigment powder are added. The glass composition for the optical black material preferably comprises the glass matrix powder of 60 to 99 volume %, the filler powder of 0 to 40 volume % and the black pigment of 1 to 30 volume %. The optical black material can be used as the partition walls.

The sealing material, structural material, and black material may preferably be used in the forms of pastes, which contain a resin binder and a solvent so that the pastes are easy to handle.

The glass composition according to the present invention does not contain lead and bismuth, and has a practically low softening point. The glass composition can be used for various products that meet environmental and safety regulations.

In display devices whose front side panel and rear side panel of plasma display panels, for example, low softening point glass compositions are used. The display devices use glass compositions for bonding of parts, electrode materials, partition walls, etc, in addition to the sealing materials.

The inventors of the present invention searched glass compositions being practical, free from lead oxide and bismuth oxide and capable of softening at low temperatures. As a result, they could invent a glass composition that meets regulations on environment and safety, and have improved water resistance and productivity. The glass composition is free from lead oxide and bismuth. This glass composition can be applied to sealing material, structural material and optical material. The sealing with the glass composition at low temperatures is applied to various fields such as sheathed heaters as well as the display devices. The above glass composition can be used as a sintering aid material for thick film wiring of silver, copper or aluminum because the glass composition does not corrode the metal materials.

The display devices need a glass composition that softens at low temperatures for various parts such as sealing, electrodes, partition walls. The display devices such as plasma display panels have a front side plate and a rear side plate, the plates being opposed to each other and peripheries thereof being sealed and the space between the plates being made vacuum or filled with discharge gas. For airtight sealing, a glass composition capable of softened at 500° C. or lower is used.

In sealing process a glass paste is coated at a sealing portion of the front side plate and/or rear side plate, and the paste is dried and pre-sintered or pre-calcined. Thereafter, the front side plate and the rear side plate are assembled and fixed with a clip, etc and heated. The glass paste is coated by a printing method or dispenser method.

In plasma display panels a space between the display panels is evacuated at the time of sealing process or after the sealing process, and a discharge gas is filled in the space. In display devices of electric field discharge type or electron discharge type the space between the panels is made high vacuum at the time of sealing process or after the sealing process.

The glass composition containing vanadium, phosphor, manganese and barium, but free from lead and bismuth has high resistance to water and intimate with metal materials. Accordingly, if display devices using the glass composition are manufactured, it is possible to provide electronic devices with durability and long term reliability because the glass composition does not corrode metal wiring such as silver and copper wiring of the electronic devices. Since it does not substantially contain lead oxide and bismuth oxide, the electronic devices using the glass composition of the present invention are not expensive and meet regulations on environment and safety regulations.

The glass composition of the present invention, which is easy to handle can be applied to wiring materials, structural materials, and black materials for display devices such as plasma display panels, as well as sealing materials. In using the glass composition a paste form of the glass composition is easy to handle. The electrodes, partition walls and black stripes of the glass composition of the present invention are good at durability and meet regulations on environment and safety as well as being not expensive. The filler powder to be added to the glass matrix controls thermal expansion coefficient of the sintered grass and flowability of the glass composition at the time of sintering in accordance with applications.

The glass compositions of the present invention can be applied to various electronic devices such as sheathed heaters in addition to display devices.

In the following the present invention will be described in detail by reference to examples.

Example 1

Glass compositions according to the present invention, which can be softened at low temperatures, were prepared. Tables 1-1, 1-2 and Tables 2-1, 2-2 show glass compositions and characteristics of the glass compositions, sintered glass compositions, and sintered silver wiring materials.

The compositions are shown by weight percent on the basis of conversion of metal oxides. The glass compositions are free from lead oxide and bismuth oxide, but contain vanadium oxide and phosphor as main ingredients.

As other ingredients, various ingredients such as alkali metal oxides and alkaline earth metal oxides (oxides of lithium, sodium, cesium, and barium) were added. As raw materials (starting materials), vanadium oxide, phosphor oxide, carbonate salts of barium, lithium, sodium and cesium were employed. As barium oxide, barium phosphate ($BaPO_3$) may be used instead of barium carbonate. In this case an amount of phosphor oxide is calculated by taking into consideration of the $BaPO_3$ used. As a manganese material, MnO or $MnO_2$ may be used. Other materials mentioned above were used in the form of oxides shown in Tables 1-1, 1-2 and Tables 2-1, 2-2.

TABLE 1-1

| No. | Glass matrix composition (% by weight) | | | | | | | Softening point (°C.) | Resistivity of glass (Ωcm) | Resistivity of Ag wiring (Ωcm) | Ag wiring evaluation |
|---|---|---|---|---|---|---|---|---|---|---|---|
| | $V_2O_5$ | $P_2O_5$ | MnO | BaO | Alkali metal oxides | $Sb_2O_3$ | Other element oxides | | | | |
| 1 | 60.0 | 21.0 | | | $K_2O$ | 15.0 | | 385 | $10^5$ order | $10^1$ order | X |
| 2 | 58.0 | 20.0 | | 5.0 | | 17.0 | | 398 | $10^5$ order | $10^2$ order | X |
| 3 | 55.0 | 25.0 | | 10.0 | | 10.0 | | 421 | $10^7$ order | $10^2$ order | X |
| 4 | 54.0 | 20.0 | | 5.0 | | 21.0 | | 417 | $10^6$ order | $10^2$ order | X |
| 5 | 54.0 | 20.0 | | 20.0 | | 5.0 | | 446 | $10^6$ order | $10^2$ order | X |
| 6 | 53.0 | 22.0 | | 5.0 | | 20.0 | | 423 | $10^7$ order | $10^3$ order | X |
| 7 | 53.0 | 22.0 | 15.0 | 10.0 | | | | 414 | $10^7$ order | $10^2$ order | X |
| 8 | 52.0 | 22.0 | | 15.0 | | 8.0 | ZnO 3.0 | 425 | $10^7$ order | $10^3$ order | X |
| 9 | 50.0 | 22.0 | | 15.0 | | 8.0 | ZnO 5.0 | 435 | $10^6$ order | $10^2$ order | X |
| 10 | 50.0 | 25.0 | | 5.0 | | 20.0 | | 446 | $10^7$ order | $10^3$ order | X |
| 11 | 48.0 | 22.0 | | 15.0 | | 10.0 | ZnO 5.0 | 440 | $10^7$ order | $10^2$ order | X |
| 12 | 47.0 | 25.0 | 8.0 | 13.0 | $Na_2O$ 1.0, $K_2O$ 2.0 | 2.0 | $TeO_2$ 2.0 | 427 | $10^8$ order | $10^0$ order | X |
| 13 | 45.0 | 25.0 | | 10.0 | | 20.0 | | 461 | $10^7$ order | $10^2$ order | X |
| 14 | 45.0 | 25.0 | | 15.0 | | 10.0 | ZnO 5.0 | 453 | $10^8$ order | $10^1$ order | X |
| 15 | 45.0 | 30.0 | | 5.0 | | 20.0 | | 482 | $10^8$ order | $10^1$ order | X |
| 16 | 45.0 | 25.0 | 8.0 | 15.0 | $Na_2O$ 1.0, $K_2O$ 2.0 | 2.0 | $TeO_2$ 2.0 | 441 | $10^8$ order | $10^{-3}$ order | Δ |
| 17 | 45.0 | 25.0 | 10.0 | 10.0 | | 10.0 | | 470 | $10^8$ order | $10^0$ order | X |

TABLE 1-2

| No. | Glass matrix composition of (% by weight) | | | | | | | Softening point (°C.) | Resistivity of glass (Ωcm) | Resistivity of Ag wiring (Ωcm) | Ag wiring evaluation |
|---|---|---|---|---|---|---|---|---|---|---|---|
| | $V_2O_5$ | $P_2O_5$ | MnO | BaO | Alkali metal oxides | $Sb_2O_3$ | Other element oxides | | | | |
| 18 | 43.0 | 25.0 | 10.0 | 15.0 | $Na_2O$ 1.0, $K_2O$ 2.0 | 2.0 | $TeO_2$ 2.0 | 449 | $10^9$ order | $10^{-3}$ order | Δ |
| 19 | 42.0 | 25.0 | 10.0 | 15.0 | $Na_2O$ 1.0, $K_2O$ 2.5 | 2.5 | $TeO_2$ 2.0 | 447 | $10^9$ order | $10^{-4}$ order | ○ |
| 20 | 42.0 | 25.0 | 10.0 | 15.0 | $Na_2O$ 1.0, $K_2O$ 2.5 | 2.0 | $TeO_2$ 2.0, $Nb_2O_5$ 0.5 | 438 | $10^9$ order | $10^{-4}$ order | ○ |
| 21 | 41.0 | 25.0 | 12.0 | 12.0 | $Li_2O$ 0.5, $Na_2O$ 1.5, $K_2O$ 3.0 | 3.0 | $TeO_2$ 2.0, ZnO 1.0 | 427 | $10^{10}$ order | $10^{-5}$ order | ◎ |
| 22 | 40.0 | 25.0 | | 15.0 | | 20.0 | | 492 | $10^8$ order | $10^0$ order | X |
| 23 | 40.0 | 30.0 | | 10.0 | | 20.0 | | 521 | $10^8$ order | $10^1$ order | X |
| 24 | 40.0 | 30.0 | | 20.0 | | 10.0 | | 540 | $10^9$ order | $10^{-3}$ order | Δ |
| 25 | 40.0 | 35.0 | | 5.0 | | 20.0 | | 529 | $10^8$ order | $10^0$ order | X |
| 26 | 40.0 | 35.0 | | 20.0 | | 5.0 | | 556 | $10^8$ order | $10^1$ order | X |
| 27 | 40.0 | 35.0 | 15.0 | 10.0 | | | | 494 | $10^9$ order | $10^{-4}$ order | ○ |
| 28 | 40.0 | 25.0 | 10.0 | 15.0 | $Na_2O$ 2.0, $K_2O$ 3.0 | 5.0 | | 446 | $10^{10}$ order | $10^{-4}$ order | ○ |
| 29 | 40.0 | 25.0 | 10.0 | 15.0 | $Na_2O$ 2.0, $K_2O$ 3.0 | 3.0 | $TeO_2$ 2.0 | 442 | $10^{10}$ order | $10^{-5}$ order | ◎ |
| 30 | 40.0 | 24.0 | 10.0 | 15.0 | $Na_2O$ 2.0, $K_2O$ 3.0 | 4.0 | $TeO_2$ 1.0, ZnO 1.0 | 439 | $10^{10}$ order | $10^{-5}$ order | ◎ |

TABLE 2-1

| No. | V$_2$O$_5$ | P$_2$O$_5$ | MnO | BaO | Alkali metal oxides | Sb$_2$O$_3$ | Other element oxides | Softening point (° C.) | Resistivity of glass (Ωcm) | Resistivity of Ag wiring (Ωcm) | Ag wiring evaluation |
|---|---|---|---|---|---|---|---|---|---|---|---|
| 31 | 40.0 | 30.0 | 10.0 | 20.0 | | | | 480 | 10$^9$ order | 10$^{-4}$ order | ○ |
| 32 | 40.0 | 30.0 | 10.0 | 15.0 | Na$_2$O 2.0, K$_2$O 3.0 | | | 473 | 10$^{10}$ order | 10$^{-5}$ order | ◎ |
| 33 | 40.0 | 25.0 | 10.0 | 15.0 | K$_2$O 1.0, Cs$_2$O 4.0 | 4.0 | TeO$_2$ 1.0 | 460 | 10$^{10}$ order | 10$^{-5}$ order | ◎ |
| 34 | 40.0 | 24.0 | 6.0 | 15.0 | Na$_2$O 1.0, K$_2$O 2.0, Cs$_2$O 2.5 | 4.0 | TeO$_2$ 0.5, ZnO 5.0 | 436 | 10$^{10}$ order | 10$^{-5}$ order | ◎ |
| 35 | 40.0 | 24.0 | 10.0 | 15.0 | Na$_2$O 1.0, K$_2$O 2.5, Cs$_2$O 2.5 | 4.0 | TeO$_2$ 1.0 | 435 | 10$^{10}$ order | 10$^{-5}$ order | ◎ |
| 36 | 40.0 | 25.0 | 5.0 | 15.0 | Na$_2$O 2.0, K$_2$O 3.0 | 3.0 | TeO$_2$ 2.0, Nb$_2$O$_3$ 5.0 | 445 | 10$^{10}$ order | 10$^{-5}$ order | ◎ |
| 37 | 40.0 | 25.0 | 12.0 | 12.0 | Na$_2$O 2.0, K$_2$O 3.0 | 3.0 | TeO$_2$ 2.0, Nb$_2$O$_3$ 1.0 | 429 | 10$^{10}$ order | 10$^{-5}$ order | ◎ |
| 38 | 40.0 | 25.0 | 10.0 | 15.0 | Li$_2$O 1.0, Na$_2$O 2.0, K$_2$O 3.0 | 1.0 | TeO$_2$ 1.0, ZnO 2.0 | 438 | 10$^{10}$ order | 10$^{-5}$ order | ◎ |
| 39 | 40.0 | 25.0 | 5.0 | 15.0 | Na$_2$O 2.0, K$_2$O 3.0 | 3.0 | TeO$_2$ 2.0, ZnO 5.0 | 435 | 10$^{10}$ order | 10$^{-4}$ order | ○ |
| 40 | 40.0 | 25.0 | 10.0 | 10.0 | Na$_2$O 2.0, K$_2$O 3.0 | 10.0 | | 456 | 10$^9$ order | 10$^{-3}$ order | Δ |
| 41 | 40.0 | 25.0 | 10.0 | 10.0 | Na$_2$O 2.0 | 13.0 | | 475 | 10$^8$ order | 10$^1$ order | X |
| 42 | 40.0 | 27.0 | 10.0 | 15.0 | Na$_2$O 2.0, K$_2$O 3.0 | 1.0 | TeO$_2$ 2.0 | 439 | 10$^{11}$ order | 10$^{-5}$ order | ◎ |
| 43 | 40.0 | 25.0 | 10.0 | 15.0 | Na$_2$O 2.0, K$_2$O 3.0 | | TeO$_2$ 2.0, SiO$_2$ 3.0 | 426 | 10$^{10}$ order | 10$^{-5}$ order | ◎ |
| 44 | 40.0 | 25.0 | 10.0 | 15.0 | Na$_2$O 2.0, K$_2$O 3.0 | | TeO$_2$ 2.0, ZnO 3.0 | 416 | 10$^9$ order | 10$^{-5}$ order | ◎ |
| 45 | 40.0 | 28.0 | 10.0 | 15.0 | Na$_2$O 2.0, K$_2$O 3.0 | | TeO$_2$ 1.0 | 431 | 10$^{11}$ order | 10$^{-4}$ order | ◎ |
| 46 | 40.0 | 25.0 | 10.0 | 15.0 | Na$_2$O 2.0, K$_2$O 3.0 | 1.0 | TeO$_2$ 2.0, Al$_2$O$_3$ 2.0 | 438 | 10$^{10}$ order | 10$^{-4}$ order | ○ |
| 47 | 40.0 | 25.0 | 10.0 | 15.0 | Na$_2$O 2.0, K$_2$O 3.0 | 3.0 | La$_2$O$_3$ 2.0 | 443 | 10$^{10}$ order | 10$^{-4}$ order | ○ |

TABLE 2-2

| No. | V$_2$O$_5$ | P$_2$O$_5$ | MnO | BaO | Alkali metal oxides | Sb$_2$O$_3$ | Other element oxides | Softening point (° C.) | Resistivity of glass (Ωcm) | Resistivity of Ag wiring (Ωcm) | Ag wiring evaluation |
|---|---|---|---|---|---|---|---|---|---|---|---|
| 48 | 40.0 | 22.0 | 10.0 | 17.0 | Na$_2$O 5.0 | 3.0 | TeO$_2$ 2.0, ZnO 1.0 | 426 | 10$^9$ order | 10$^5$ order | ◎ |
| 49 | 38.0 | 30.0 | 10.0 | 5.0 | | 26.0 | TeO$_2$ 2.0, ZnO 5.0 | 481 | 10$^8$ order | 10$^5$ order | X |
| 50 | 38.0 | 28.0 | 10.0 | 15.0 | Na$_2$O 2.0, K$_2$O 3.0 | | TeO$_2$ 2.0, ZnO 1.0 | 435 | 10$^{11}$ order | 10$^7$ order | ◎ |
| 51 | 37.0 | 27.0 | 10.0 | 15.0 | Li$_2$O 1.0, Na$_2$O 2.0, K$_2$O 3.0 | 1.0 | TeO$_2$ 2.0, ZnO 1.0 | 438 | 10$^{11}$ order | 10$^6$ order | ◎ |
| 52 | 35.0 | 25.0 | 10.0 | 15.0 | Na$_2$O 2.0, K$_2$O 3.0, Cs$_2$O 3.0 | 5.0 | TeO$_2$ 2.0 | 451 | 10$^9$ order | 10$^8$ order | ○ |
| 53 | 35.0 | 30.0 | | 15.0 | | 20.0 | | 550 | 10$^8$ order | 10$^7$ order | X |
| 54 | 35.0 | 30.0 | | 20.0 | | 15.0 | | 571 | 10$^8$ order | 10$^7$ order | X |
| 55 | 35.0 | 30.0 | 10.0 | 15.0 | Na$_2$O 2.0, K$_2$O 3.0 | 3.0 | TeO$_2$ 2.0 | 475 | 10$^{11}$ order | 10$^7$ order | ◎ |
| 56 | 35.0 | 35.0 | | 20.0 | | 10.0 | | 580 | 10$^9$ order | 10$^8$ order | Δ |
| 57 | 35.0 | 30.0 | | 15.0 | | 20.0 | | 554 | 10$^8$ order | 10$^7$ order | X |
| 58 | 33.0 | 27.0 | 10.0 | 15.0 | Na$_2$O 2.0, K$_2$O 3.0 | 3.0 | TeO$_2$ 2.0, ZnO 5.0 | 487 | 10$^{11}$ order | 10$^7$ order | ○ |
| 59 | 30.0 | 30.0 | 20.0 | 15.0 | Na$_2$O 2.0, K$_2$O 3.0 | | | Crystalized | 10$^{11}$ order | Difficult to evaluation due to crystalization | |
| 60 | 30.0 | 30.0 | 10.0 | 25.0 | Na$_2$O 2.0, K$_2$O 3.0 | | | 602 | 10$^{11}$ order | Too high softening point, not evaluated | |
| 61 | 30.0 | 30.0 | 10.0 | 15.0 | Na$_2$O 4.0, K$_2$O 6.0 | | | 508 | 10$^{10}$ order | Poor water resistance, not evaluated | |

The glass compositions were prepared in the following manner. The ingredients (compounds) of the glass compositions powder were weighed and mixed. 300 Grams of the mixtures were put into a crucible. Each of the mixtures was heated to 1100° C. at a temperature rise rate of 5 to 10° C./min. in an electric furnace and the mixtures were maintained at that temperature for two hours. The mixtures were stirred during the temperature maintenance to thereby make the compositions homogeneous.

After the crucible was taken out from the furnace, and the glass mixtures were flown on a stainless steel plate, which was heated to 200 to 300° C. in advance. Thereafter, the mixture compositions were crushed. The glass compositions were subjected to differentiated thermal analysis (DTA) to thereby measure softening points thereof. The softening points are defined as the second thermal absorption peak of DTA curves.

The crushed glass compositions of frit state were made into pastes by mixing them with a resin binder and a solvent. As the resin binder, ethyl cellulose was used, and as the solvent diethylene glycol monobutyl ether acetate was used.

Then, thick film form glass compositions were prepared using the pastes. As shown in FIG. 1, the thick film silver wirings 2, 3, 4 were prepared by sintering the glass composition pastes on a glass substrate 1. Sizes of the thick film silver wirings were 5 μm thick, 100 μm wide and 50 mm long, and the space between the stripes was 5 mm. Resistivity of the thick film silver wirings was about 10$^{-5}$ Ωcm at 25° C. under 100 V.

Glass pastes containing no silver powder were coated over the thick film silver wirings 2, 3, 4 and the glass substrate so as to form a thick film glass coating 8 and thick film coatings 5, 6, 7. The coatings were dried at about 250° C. for two hours, and then they were heated to a temperature higher than the softening temperature by 30 to 50° C. at a temperature rise rate of 5° C./min. in an electric furnace. After the temperature was kept for 30 minutes, the glass coatings were cooled in the furnace to thereby sinter the glass coatings to form thick film glass stripes 5, 6, 7. The sizes of the stripes were 10 μm thick, 100 μm wide and 50 mm long. The spaces between the stripes 5, 6, 7 were 5 mm. The glass film 8 had a thickness of 30 μm, a width of 25 mm and a length of 25 mm.

Electric resistivity of the thick film silver wiring 2, 3, 4 and thick film glass films 5, 6, 7 was measured at 25° C. under 100 V. Average values of the resistivity were calculated. The resistivity was measured with Loresta AP manufactured by Mitsubishi Chemical Corp. The results are shown in Tables 1-1 and 1-2.

When the average resistivity of the thick film silver wirings 2, 3, 4, which were covered with the glass film (sintered glass) 8 is in the order of $10^{-5}$ Ωcm (1 to 9.9 ... ×$10^{-5}$ Ωcm), the films were evaluated as ⊚ (excellent); when the average value was in $10^4$ Ωcm order (1 to 9.9 ... ×$10^{-4}$ Ωcm), the films were evaluated as ○ (good); when the average resistivity is in $10^{-3}$ order (1 to 9.9 ... ×$10^{-3}$ Ωcm), the films were evaluated as Δ (poor); and when the average resistivity was in $10^{-2}$ Ωcm or more, the films were evaluated as X (bad) because such films are difficult to use them for wiring.

Figure 2:
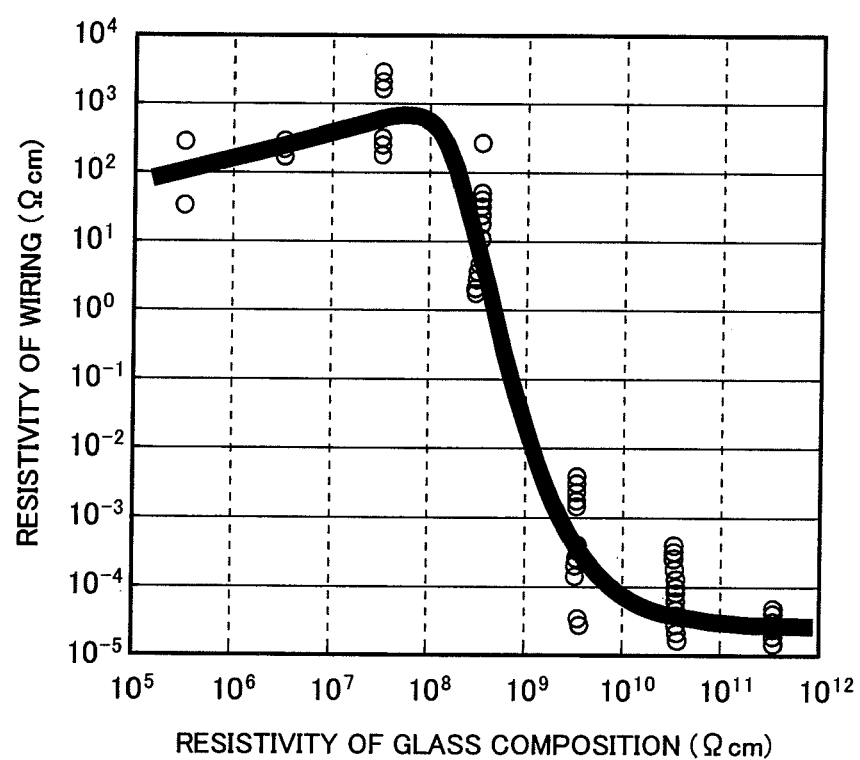
FIG. 2 is a graph showing a relationship between resistivity of wires and resistivity of glass compositions.

FIG. 2 shows a relationship between resistivity of the sintered glass composition film 8 at 25° C. and resistivity of the wirings 2, 3, 4 covered with the glass film (sintered glass) 8. If the resistivity of the glass composition whose main ingredients are vanadium oxide and phosphor oxide is $10^9$ Ωcm or more, the resistivity of the thick film silver wiring was satisfactory. Particularly, if the resistivity of the sintered glass of the glass composition is $10^{10}$ Ωcm or more, the resistivity of the thick film silver wiring did not increase.

On the other hand, if the resistivity of the sintered glass of the glass composition is $10^8$ Ωcm or less, the resistivity of the thick film silver wiring increases drastically. It has been revealed that silver reacted with the components of the glass composition to form silver vanadate. On the other and, when the glass composition with high resistivity was used, formation of silver vanadate was hardly recognized. It is thought that the formation of silver vanadate changes or lowers resistivity of the thick film silver wiring. In order to obtain high resistivity of the glass composition, addition of manganese oxide and barium oxide to the glass matrix is preferable. Further, addition of alkali metal oxides to the glass composition is preferable to get high resistivity.

Furthermore, addition of at least one oxide of antimony, tellurium, zinc, silicon, aluminum, niobium, and rare earth elements to obtain stability of glassfication and chemical stability of the glass matrix.

As a result of comparison of various glass compositions, If a content of $V_2O_5$ is less than 33% by weight, the softening point increases, which is not suitable for bonding at low temperatures, and if the content of $V_2O_5$ is larger than 45% by weight, resistivity decreases and the glass composition reacts with silver, which increases resistivity of the silver wiring.

If a content of $P_2O_5$ is less than 22% by weight, the glass composition tends to crystallize, which leads to high softening temperatures. If the content of $P_2O_5$ is larger than 30% by weight, the softening point increases.

If a content of MnO is less than 5% by weight, the glass composition tends to react with silver, and when the content is larger than 15% by weight, the glass composition tends to crystallize.

If a content of BaO is less than 10% by weight, the glass composition tends to crystallize, and when the content is larger than 20% by weight, the softening point increases.

If a content of $R_2O$ (R is alkali metals) is larger than 8% by weight, chemical stability of the glass composition may be degraded, and thermal expansion coefficient becomes large, which leads to peeling-off of the sintered glass film from the substrate, etc.

If a total amount of $Sb_2O_3$, $TeO_2$, ZnO, $SiO_2$, $Al_2O_3$, $Nb_2O_5$ and $La_2O_3$ is larger than 10% by weight, the glass composition tends to glassfy, which leads to increase in the softening temperature.

Accordingly, a preferable glass composition can give a sintered glass having electric resistivity of $10^{10}$ Ωcm or more, and a softening point of 500° C. or lower, and contents of $V_2O_5$ being 33 to 45% by weight, $P_2O_5$ being 22 to 30% by weight, MnO being 5 to 15% by weight, and BaO being 10 to 20% by weight. $R_2O$ should be 0 to 8% by weight, and the total content of $Sb_2O_3$, $TeO_2$, ZnO, $SiO_2$, $Al_2O_3$, $Nb_2O_5$ and $La_2O_3$ should be 0 to 10% by weight.

Example 2

As same as example 1 and using the information acquired in example 1, glass compositions shown in Table 3 were prepared and they were evaluated. Table 3 shows the glass compositions and characteristics of sintered glass of the glass composition. None of the glass compositions contain lead oxide and bismuth oxide, but main components were vanadium oxide and phosphor oxide. As other ingredients, oxides of manganese, barium and alkali metals were added. 2 to 4 components of tellurium oxide, zinc oxide, niobium oxide, iron oxide, tungsten oxide and molybdenum oxide were added.

TABLE 3

| | Glass matrix composition (% by weight) | | | | | | | | | Softening point (° C.) | Resistivity of glass (Ωcm) | Resistivity of Ag wiring (Ωcm) | Ag wiring evaluation |
|---|---|---|---|---|---|---|---|---|---|---|---|---|---|
| No. | $V_2O_5$ | $P_2O_5$ | MnO | BaO | $Na_2O$ | $K_2O$ | ZnO | $WO_3$ | Other element oxides | | | | |
| 62 | 40.0 | 25.0 | 10.0 | 10.0 | 2.0 | 3.0 | 5.0 | 5.0 | | 443 | $10^9$ order | $10^{-4}$ order | ○ |
| 63 | 35.0 | 25.0 | 8.0 | 10.0 | 1.0 | 2.0 | 9.0 | 5.0 | $MoO_3$ 5.0 | 438 | $10^9$ order | $10^{-5}$ order | ⊚ |
| 64 | 35.0 | 25.0 | 10.0 | 10.0 | 2.0 | 3.0 | 10.0 | 5.0 | | 444 | $10^9$ order | $10^{-5}$ order | ⊚ |
| 65 | 35.0 | 25.0 | 5.0 | 10.0 | 2.0 | 3.0 | 8.0 | 7.0 | $Fe_2O_3$ 5.0 | 448 | $10^9$ order | $10^{-5}$ order | ⊚ |
| 66 | 35.0 | 25.0 | 8.0 | 5.0 | 2.0 | 3.0 | 9.0 | 5.0 | $Fe_2O_3$ 3.0, $TeO_2$ 5.0 | 439 | $10^9$ order | $10^{-5}$ order | ⊚ |
| 67 | 34.0 | 27.0 | 5.0 | 10.0 | 1.0 | 3.0 | 10.0 | 5.0 | $Fe_2O_3$ 5.0 | 455 | $10^9$ order | $10^{-5}$ order | ⊚ |
| 68 | 34.0 | 26.0 | 8.0 | 8.0 | 1.0 | 2.0 | 10.0 | 10.0 | $Nb_2O_5$ 1.0 | 447 | $10^9$ order | $10^{-5}$ order | ⊚ |
| 69 | 33.0 | 25.0 | 10.0 | 10.0 | | 2.0 | 10.0 | 10.0 | | 455 | $10^9$ order | $10^{-5}$ order | ⊚ |
| 70 | 33.0 | 26.0 | 9.0 | 10.0 | | 4.0 | 9.0 | 9.0 | | 442 | $10^{10}$ order | $10^{-5}$ order | ⊚ |
| 71 | 32.0 | 26.0 | 8.0 | 10.0 | 1.0 | 3.0 | 10.0 | 10.0 | | 447 | $10^9$ order | $10^{-5}$ order | ⊚ |

TABLE 3-continued

| | Glass matrix composition (% by weight) | | | | | | | | | Softening | Resistivity of glass | Resistivity of Ag wiring | Ag wiring |
|---|---|---|---|---|---|---|---|---|---|---|---|---|---|
| No. | $V_2O_5$ | $P_2O_5$ | MnO | BaO | $Na_2O$ | $K_2O$ | ZnO | $WO_3$ | Other element oxides | point (° C.) | ($\Omega$cm) | ($\Omega$cm) | evaluation |
| 72 | 31.0 | 26.0 | 7.0 | 8.0 | 1.0 | 2.0 | 5.0 | 5.0 | $Fe_2O_3$ 5.0, $TeO_2$ 5.0, $MoO_3$ 5.0 | 440 | $10^{10}$ order | $10^{-5}$ order | ◎ |
| 73 | 31.0 | 25.0 | 10.0 | 10.0 | | 4.0 | 10.0 | 10.0 | | 448 | $10^{10}$ order | $10^{-5}$ order | ◎ |
| 74 | 30.0 | 26.0 | 9.0 | 10.0 | 2.0 | 3.0 | 10.0 | 10.0 | | 451 | $10^{10}$ order | $10^{-5}$ order | ◎ |
| 75 | 30.0 | 27.0 | 5.0 | 10.0 | | 3.0 | 10.0 | 5.0 | $Fe_2O_3$ 5.0, $MoO_3$ 5.0 | 455 | $10^{10}$ order | $10^{-5}$ order | ◎ |
| 76 | 25.0 | 30.0 | 5.0 | 10.0 | | 2.0 | 10.0 | 8.0 | $Fe_2O_3$ 10.0 | 525 | $10^9$ order | $10^{-5}$ order | ◎ |

By virtue of information of example 1, the glass compositions shown in Table 3 exhibited resistivity of $10^9$ $\Omega$cm or more and hardly reacted with the silver wiring, which did not increase resistivity of the silver wiring. The glass composition of No. 76, however, that contained less than 30% by weight and contained the total amount of ZnO, $Fe_2O_3$ and $WO_3$ exceeding 25% by weight exhibited a high softening point. Other glass compositions than No. 76 exhibited softening point lower than 500° C.

Comparison of the all glass compositions including those of example 1 revealed that if the amount of $V_2O_5$ was less than 30% by weight, the softening point increased, which was not suitable for bonding at low temperatures.

If an amount of $V_2O_5$ exceeds 45% by weight, resistivity decreases and the glass composition reacts with silver wiring to thereby increase resistivity of the wiring.

If an amount of $P_2O_5$ is less than 22% by weight, the glass composition tends to crystallize, and if the amount exceeds 30% by weight, a softening point increases.

If an amount of MnO is less than 5% by weight, and if the amount of MnO is larger than 15% by weight, the glass composition tends to crystallize.

If an amount of BaO is less than 5% by weight, the glass composition tends to crystallize, and if the amount of BaO exceeds 20% by weight, the softening point increased.

If an amount of $R_2O$ exceeds 8% by weight, chemical stability of the glass composition degrades and a thermal expansion coefficient becomes too large so that the glass film tends to be peeled off from the wiring or the substrate.

If a total amount of $Sb_2O_3$, $TeO_2$, ZnO, $SiO_2$, $Al_2O_3$, $Nb_2O_5$, $La_2O_3$, $Fe_2O_3$, $WO_3$ and $MoO_3$ exceeds 25% by weight, the glass composition tends to crystallize and the softening point increases.

Accordingly, a preferable glass composition has a resistivity of $10^9$ $\Omega$cm or more, a softening point of 500° C. or lower, and it hardly crystallizes and has good chemical stability. Thus, the composition comprises 30 to 45% by weight of $V_2O_5$, 22 to 30% by weight of $P_2O_5$, 5 to 15% by weight of MnO, 5 to 20% by weight of BaO, 0 to 8% by weight of $R_2O$ (R: alkali metals), and 0 to 25% by weight of at least one of $Sb_2O_3$, $TeO_2$, ZnO, $SiO_2$, $Al_2O_3$, $Nb_2O_5$, $La_2O_5$, $Fe_2O_3$, $WO_3$ and $MoO_3$.

As same as in example 1, compatibility between copper wiring or aluminum wiring and the glass composition of example 1 was investigated. The glass compositions used were Nos. 16, 20, 21, 30 in Tables 1-1, 1-2 and Nos. 42, 50 in Tables 2-1, 2-2. Thick film copper films and aluminum sputter wirings were formed on a substrate in the manner in example 1, then, thick glass films of the glass compositions were formed on the copper and aluminum films. In this example, in order to prevent oxidation of the wirings, sintering of the glass compositions were conducted in nitrogen atmosphere. As a resin binder for the glass pastes, nitrocellulose, which can be burnt in the nitrogen atmosphere, was used.

In case of the thick film copper wiring, results were the same as in the thick film silver wiring of example 1. When the resistivity of the glass composition is $10^8$ $\Omega$cm or less, the resistivity of the thick film copper wiring increased drastically. As a result of investigation on the above phenomenon, it was reveled that copper reacted with the glass composition to form copper vanadate. On the other hand, if the resistivity of the glass composition is $10^9$ $\Omega$cm or more, the resistivity of the thick film copper wiring was satisfactory, especially, if the resistivity of the glass composition is $10^{10}$ $\Omega$cm or more, the resistivity of the thick film copper wiring hardly increased. In addition, formation of copper vanadate was hardly recognized.

In case of aluminum sputter film wiring, aluminum did not react with the glass composition regardless of the resistivity of the glass compositions so that satisfactory resistance of wirings was provided.

Example 4

In example 4, kinds of filler powders to be added to the glass compositions and contents were investigated. Used fillers were powders of β-eucryptite, mullite, amorphous silica, alumina, zirconium silicate and zirconium phosphate. An average particle size of the filler powders was 20 to 30 μm. An average particle size of the glass powder was 5 to 10 μm.

The glass compositions and filler powders were mixed to prepare pastes in the same manner as in example 1. The pastes were coated on a glass substrate, dried and heated to 480° C. for 30 minutes in air to form glass thick films. Flowability and devitrification in the sintering process were evaluated. Contents of the filler powder were changed from 10, 20, 30, 40 and 50 volume %. It has been revealed that the glass compositions did not devitrify until an amount of filler powder became 40% by volume in any filler powders. When the amount was 50% by volume, devitrification took place and airtight sealing was impossible to obtain. Accordingly, the glass composition containing the filler powder can be used as the sealing material if the amount of the filler content is up to 40% by volume.

Resistivity of the thick films was measured. Since all the filler powders were electrical insulators, the resistivity of the glass compositions to which the insulating fillers were added did not decrease their resistivity.

According to observation of the thick films at the time of preparation, large differences among the glass compositions were not found. When mullite, alumina or zirconium phosphate, which has a large specific gravity was used, the glass compositions exhibited particularly excellent flowability. The zirconium phosphate exhibited best flowability of the three. It is thought that since the glass compositions of the present invention contain vanadium oxide and phosphor as main ingredients, they have good wettability with phosphate type fillers.

Then, compatibility between silver wiring and the glass compositions to which the filler powders were added was investigated. The glass compositions of No. 21 in Table 1-2 and Nos. 42 and 50 in Tables 2-1, 2-2 and fillers were made into glass pastes containing 30% by volume of fillers. The resulting glass pastes were coated on the thick film silver wiring shown in FIG. 1, dried and heated to 480° C. for 30 minutes in air. The fillers used were mullite, alumina and zirconium phosphate.

Electric resistance of the thick film silver wirings was measured in the same manner as in example 1 to obtain resistivity. As a result, any of the glass compositions did not increase resistivity of the thick film silver wirings as same as the glass compositions (free from fillers) in example 1. That is, the glass compositions can be applied to bonding or sealing various parts where wirings are covered with the glass compositions.

Glass compositions containing large amounts of filler powders have been subjected to evaluation. As mentioned above, if the amount of filler powder is large, the glass compositions may devitrify in the sintering step. If the amount of filler powder is 40 to 70% by volume (the residue is the glass matrix), the glass compositions could be satisfactorily sintered, though airtight bonding was difficult to obtain. Accordingly, such the glass compositions containing large amounts of filler powders can be applied to partition walls of structural materials for plasma display panels.

The glass compositions shown in Tables 1 and 2 are black. Therefore, they can be applied to optical black materials. In order to enhance the black color, black pigments may be added to the glass compositions. An additive amount of the black pigment is preferably 30% by volume so as to keep good flowability and to prevent devitrification. As the optical black parts, black matrixes or black stripes of plasma display panels.

Example 5

In example 5, particle size of the filler powder was investigated. As a glass composition, No. 42 glass composition powder in Table 2-1 was used. A thermal expansion coefficient of the No. 42 glass composition (i.e., sintered glass) was $119 \times 10^{-7}$/° C. An average particle size of the No. 42 glass composition powder was 7 μm. An amount of filler powder was constant at 30% by volume. The filler powders of zirconium phosphate had particle sizes of 1, 3, 7, 12, 25, 40 and 50 μm, respectively. 70% by volume of No. 42 glass composition and 30% by volume of each zirconium phosphate filler powder were mixed and molded. The moldings were heated to 460° C. for 30 minutes in air to obtain sintered products.

Figure 3:
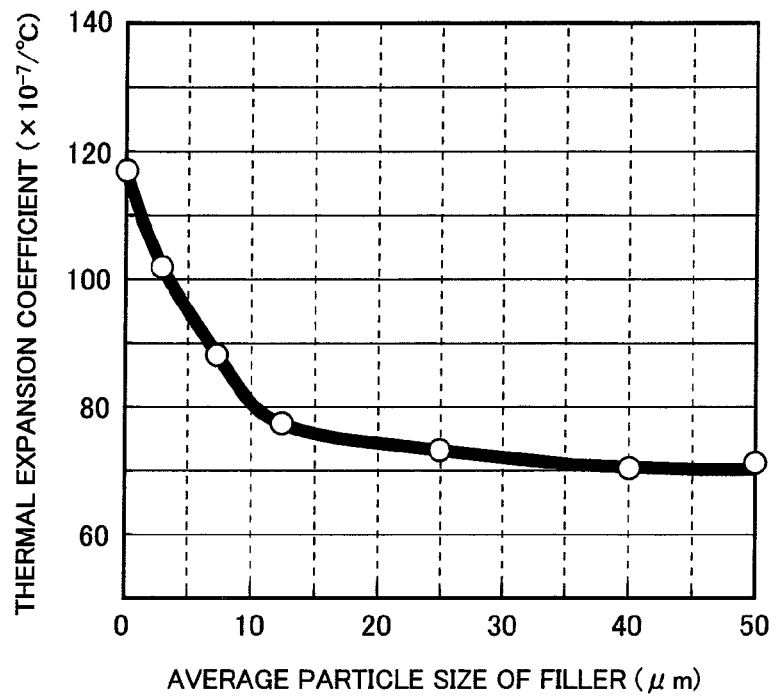
FIG. 3 is a graph showing a relationship between an average particle size of filler and thermal expansion coefficients of sealing materials.

Influence of the article size of the filler powder on thermal expansion coefficient was investigated. Samples of 4×4×20 mm were cut out from the sintered products. Using a thermal expansion meter, thermal expansion curves were obtained at a temperature rise rate of 5° C./min. The thermal expansion coefficients were obtained in a temperature range between 30° C. and 250° C. FIG. 3 shows a relationship between the average particle size of the filler powder and thermal expansion coefficients of the glass compositions containing the filler powders. As the particle size increases, thermal expansion coefficients became smaller. The thermal expansion coefficients decreased remarkably until the average particle size of 12 μm, and thereafter, the coefficients decreased gradually. Accordingly, in order to lower the thermal expansion coefficients of the glass compositions effectively, fillers having an average particle size of 12 to 40 μm should be added.

Example 6

In example 6, the glass compositions of the present invention were applied to wiring materials for forming thick film metal wiring. The wiring is formed by sintering a wiring material comprising the glass composition powder, metal powder for wiring, a resin binder and a solvent. In this example, No. 42 glass composition in Table 2 was used. No. 42 glass composition hardly increases resistivity of silver. As the resin binder, ethyl cellulose was used and diethylene glycol monobutyl ether acetate was used as the solvent.

The glass composition powder was mixed with silver powder, and the resin binder and the solvent were added to the mixture to obtain a wiring paste.

Similarly, wiring pastes of which mixing ratios of the glass composition powder and silver powder were changed were prepared. Using the prepared wiring pastes, the pastes were coated on the glass substrate by a printing method, and the coatings were calcined at 480° C. for 30 minutes in air to obtain desired wiring.

Figure 4:
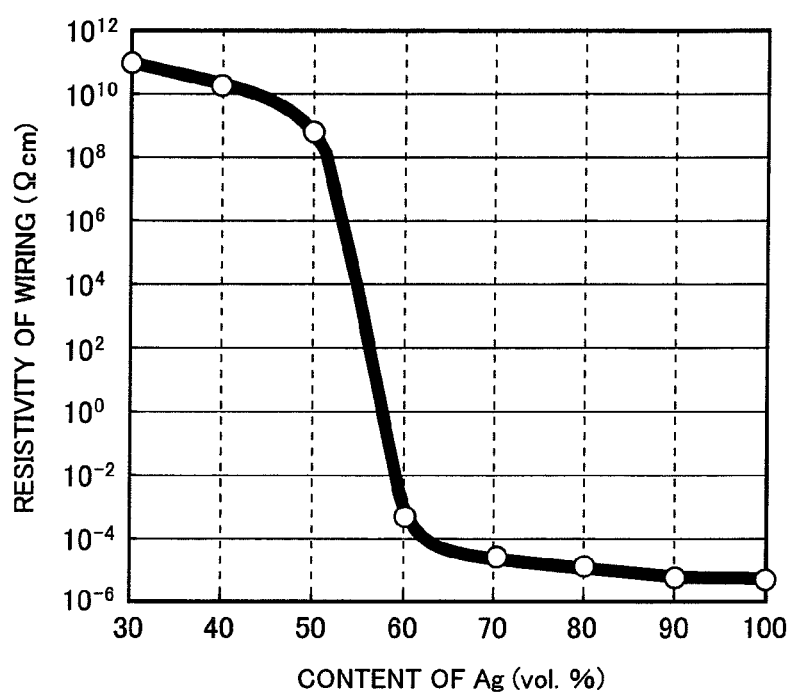
FIG. 4 is a graph showing a relationship between resistivity of wires and silver contents of glass compositions.

Resistance of the resulting wiring was measured to obtain resistivity. FIG. 4 shows a relationship between contents of silver powder and resistivity of the wiring. If the amount of silver powder is larger than 60% by volume (the residue is the glass composition), resistivity of the wiring was sufficiently low. Accordingly, if the content of the glass composition is 40% by volume or less, the glass composition can be applied to the wring material.

If the content of the glass composition is too small, the sintered or calcined wiring may tend to be peeled off from the substrate. If the content of the glass composition is 10% by volume or more, the sintered wiring could be bonded firmly to the substrate. When the various filler powders listed in example 3 are mixed with the wiring materials, silver wiring did not peel off. Since resistivity increases when the filer is added, a preferable amount is 20% by volume or less. That is, a preferable wiring material that comprises 10 to 40% by volume of the glass composition, 60 to 90% by weight of silver powder and 0 to 20% by weight of the filler powder is provided. Particularly, a preferable wiring material comprises 15 to 35% by volume of the glass composition, 65 to 85% by weight of silver powder and 5 to 15% by weight of the filler powder.

Similarly, a copper wiring material was investigated. As the glass composition, No. 55 in Table 2-2 was used, and the glass composition powder was mixed with copper powder. Then, a resin binder and a solvent were added to the mixture to prepare a copper wiring paste. The resin binder was nitrocellulose and the solvent was diethylene glycol monobutyl ether acetate. The prepared paste was coated on a glass substrate by a printing method, and the coating was heated at 600° C. for 30 minutes in nitrogen stream to form wiring. Resistivity of the resulting wiring was measured. The result was the same as in the silver wiring paste. Accordingly, the glass composition of the present invention can be applied to the wiring material.

However, if the resistivity of the glass composition is less than $10^9$ Ωcm, resistivity of the wiring will increase drastically due to reaction between the glass composition and copper.

Example 7

Using the glass compositions of Nos. 68, 71 and 73 in Table 2-2, thick film wiring materials of silver, copper and aluminum were investigated in the same manner as in example 6. 10% by volume of each glass composition and 90% by volume of silver powder, copper powder or aluminum powder were mixed. The resin binder and solvent were added to the mixture to prepare the wiring pastes. The silver powder, copper powder and aluminum powder were each globular powder with a particle size of about 1 µm and flake powder, which was obtained by pressing the globular powder. The globular powder and the flake powder were mixed at 1:1. The resin binder was ethyl cellulose for silver and aluminum, and nitrocellulose for copper. The solvent was diethylene glycol monobutyl ether acetate.

The resulting pastes were coated on a glass substrate by a printing method, and the coatings were calcined in air in case of silver and aluminum and in nitrogen in case of copper. The coatings were heated at 500° C. for 30 minutes to form wirings. Resistivity of the wirings was measured. As a result, the same results as in example 6 were obtained. Accordingly, the glass compositions of the present invention can be applied to thick film wirings of silver, aluminum and copper.

Example 8

Figure 5:
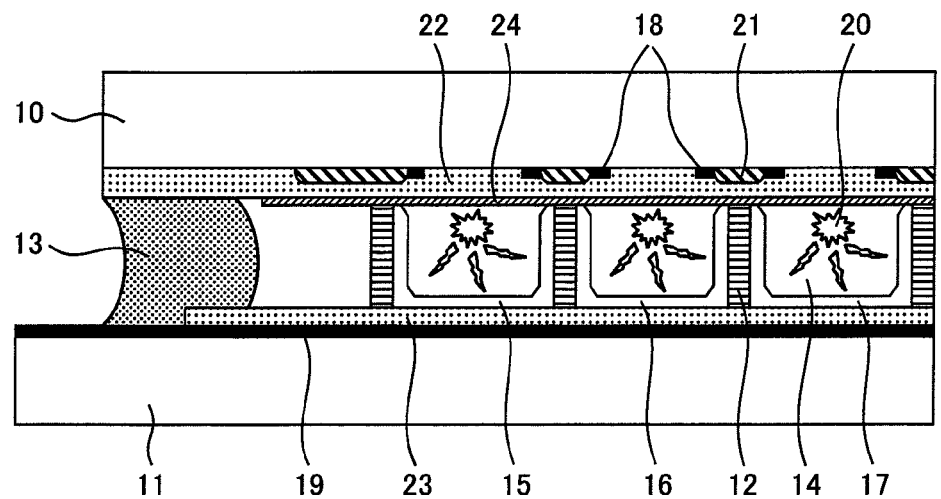
FIG. 5 is a cross sectional view of a typical plasma display panel to which the present invention is applied.

In example 8 a plasma display panel to which the glass composition of the present invention is applied will be explained. The diagrammatic view of the plasma display panel is shown in FIG. 5.

The plasma display panel comprises a front side plate 10 and a rear side plate 11 being opposed to each other with a space of 100 to 150 µm wherein the space is maintained by means of partition walls 12 to constitute a great number of cells 14, which are partitioned by the walls 11. The peripheries of the front side plate and rear side plate are sealed with sealing member 13, and each of the cells is filled with the rare gas. Each of the cells is one of red fluorescent, green fluorescent and blue fluorescent 15, 16, 17, correspondingly. Three colors fluorescent cells constitute one pixel. Each pixel illuminates in accordance with display signals.

There are formed electrodes on the front side and rear side plates 10, 11, the electrodes being arranged regularly. Display electrodes 18 on the front side plate 10 and address electrodes 19 on the rear side plate are opposed to constitute a pair. A voltage of 100 to 200 V is applied between the electrodes 18, 19 to effect discharge with ultraviolet ray 20, which excites the fluorescents 15, 16, 17 to illuminate to display images. The display electrodes 18 and address electrode 19 are covered with dielectric material layers 22, 23 to protect the electrodes and to control wall charges at the time of discharge.

Partition walls 12 for forming the cells are provided on the dielectric material layer 23 on the address electrodes 19 of the rear side plate 11. The partition walls have a shape of stripes or boxes. In order to increase contrast, black matrix (black stripes) 21 may be formed between the adjoining cells.

As the display electrodes 18 and address electrodes 19, silver thick film wiring has been used. However, for the countermeasure of the migration of silver, it has been studied to shift the silver thick film wiring to copper thick film wiring. Thus, anti-oxidation of copper is necessary. Although formation of the display electrodes 18, address electrodes 19 and black matrix can be made by a sputtering method, a printing method is preferred because of cost reduction. The dielectric layers 22, 23 are generally formed by the printing method.

The dielectric layer 22 is formed on all over the front side plate 10 after the black matrix 21 and the display electrodes 18 are formed so that the display electrodes and black matrix intersect orthogonally the address electrodes 19. A protective layer 24 is formed on the dielectric layers 22 so as to protect the display electrodes 18, etc from discharge. Generally, as the protective layer 24, MgO evaporated film is used.

Partition walls made of glass comprise a structural material containing at least a glass composition and a filler. The structural material is sintered. The partition walls are formed by a process wherein a vaporizable sheet having grooves is adhered to portions to be walls; a paste is filled in the grooves; and the paste is sintered at 500 to 600° C. to thereby evaporate the sheet and to form the partition walls 12.

Pastes of fluorescents 15, 16, 17 are filled in the cells and heated to 450 to 500° C. to calcine them.

Generally, the front side plate 10 and the rear side plate each of which is prepared separately in advance are opposed to each other and aligned precisely. Thereafter, the peripheries thereof are sealed with glass composition at 420 to 500° C. The sealing material 13 is applied to the periphery of one of the plates 10, 11 by a dispenser method or a printing method. Generally speaking, the sealing material 13 is applied to the rear side plate 11.

The sealing material may be pre-sintered at the time the fluorescents 15, 16, 17 are sintered. By this method, bubbles in the glass sealed portion can be eliminated sufficiently so that glass sealing portion with high air-tightness will be obtained. After glass sealing process, the gas in the cells 14 is evacuated, while heating the cells 14, and rare gas is filled in the cells.

The glass sealing material 13 may be brought into direct contact with the display electrodes 18 and/or address electrodes 19 at the time of sintering or pre-sintering of the glass sealing material. If this happens, the sealing material 13 reacts with the wiring material such as silver, etc to increase resistivity of the wiring material. Since the increase in resistivity is not favorable, the reaction should be avoided. It is necessary to prevent reaction of the glass composition with the wiring material.

In lightning the display panel, a voltage is applied at the crossing points of the display electrodes 18 and the address electrodes 19 to thereby effect discharge of rare gas in the cells 14 to form plasma. The rare gas in the plasma state releases ultraviolet ray 20 when the plasma gas returns to the normal state. The ultra violet ray excites the fluorescents 15, 16, 17 to illuminate to light on the display panel so as to display images.

In lightning the fluorescents 15, 16, 17, address discharge between the display electrodes 18 and the address electrodes 19 is conducted to accumulate charges in the cells. Thereafter, when a prescribed voltage is applied to the display electrodes, display discharge takes place only at the cells where the charges are stored to generate ultraviolet ray that makes the fluorescents illuminate.

The sealing material comprising the glass matrix and the filler powder studied in example 4 was applied to the plasma display panel shown in FIG. 5. A thermal expansion coefficient of the sealing material was set to 70 to $75 \times 10^{-7}/°$ C. by controlling mixing rates of the filler powder. Since the thermal expansion coefficients of the front side plate 10 and the rear side plate 11 each being made of glass were 80 to $85 \times 10^{-7}/°$ C., the thermal expansion coefficient of the sealing material was made smaller than that of the glass plates by 10 to 15% so as to impart compression force on the sealing material.

At first, No. 42 glass composition powder in Table 2-1 and zirconium phosphate powder as a filler were thoroughly mixed. A mixing rate was 70% by volume of the glass composition and 30 volume % by weight. An average particle size of the No. 42 glass composition was 7 µm and an average particle size of the filler was 30 µm. A resin binder (ethyl cellulose) and a solvent (diethylene glycol monobutyl ether acetate) were added to the mixture to prepare a sealing paste. The paste exhibited a thermal expansion coefficient of $72 \times 10^{-7}/°$ C.

The resulting paste was coated on the periphery of the rear side plate 11 by the dispenser method. The coating was dried at 200° C., and the coating was sintered at 480° C. for 30 minutes in air. The resulting rear side plate 11 and the front side plate 10 were opposed precisely to each other. While evacuating the space between the plates, which were fixed by clipping, they were heated to 450° C. and kept at the temperature for 3 hours. Then, rare gas was filled in the space, and cooled. The panel was sealed air tightly. At the time of lightning of the panel, there was no problem Using the glass composition powders of Nos. 16, 20, 21 and 30 in Table 1-2 and Nos. 50 in Table 2-2, plasma display panels were prepared in the same manner as in the above processes. As the filler, powders of β-eucryptite, mullite, amorphous silica, alumina, zirconium silicate and zirconium phosphate were used. Amounts of the fillers were changed differently. Any of the sealing materials exhibited thermal expansion coefficients of 70 to $75 \times 10^{-7}/°$ C.

As a result, irrespective of kinds of filler powders, a suitable content of the filler powder was 15 to 40% by volume (the residue is 85 to 60% by weight). If the content of the filler is less than 15% by weight, the coated sealing material may be sucked into the space of the panel at the time of evacuation so that airtightness of the sealed portion was not maintained. If the content is more than 40% by volume, the sealing material is not sufficiently collapsed at the time of evacuation and bonding force was not enough.

No. 42 glass composition in Table 2 was applied to the display electrodes 18 of the front side plate 10 and the address electrodes 19 of the rear side plate 11. The wiring material comprises No. 42 glass composition in an amount of 15% by weight, zirconium phosphate as the filler in an amount of 5% by volume and silver powder in an amount of 80% by volume. The wiring material was made into a paste. Using the plates, a plasma display panel was prepared. There was no problem in the panel. A panel lightning test showed there was no problem. Accordingly, the glass compositions can be applied to the display electrodes and address electrodes of the plasma display panel.

Then, No. 42 glass composition was used for the partition wall 12. The partition material comprises No. 42 glass composition in an amount of 40% by volume, mullite powder as the filler in an amount of 30% by volume and alumina powder in an amount of 30% by volume. In the same manner as in the previous processes, a display panel was prepared. The partition material did not show any problem even in lightning tests. Accordingly, the glass composition can be applied to the partition wall.

No. 24 glass composition was used for black matrix 21. The matrix material comprises No. 42 glass composition in an amount of 60% by volume, amorphous silica in an amount of 30% by volume and a black pigment in an amount of 10% by volume. Using the black matrix material, a display panel was prepared. The display panel using the black matrix material did not show any problem.

Example 9

Figure 6:
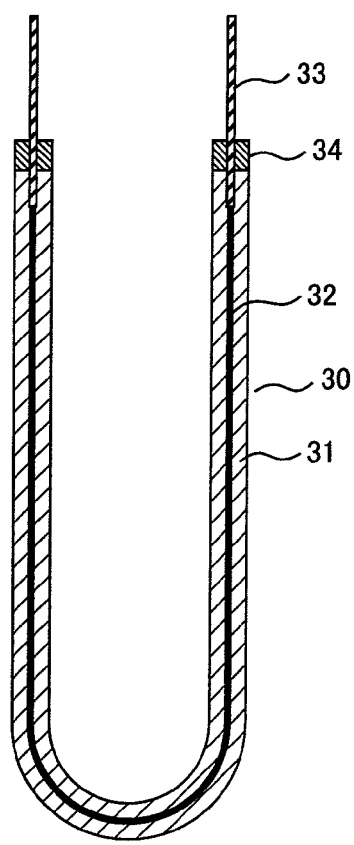
FIG. 6 is a cross sectional view of a typical sheathed heater to which the present invention is applied.

In this example, the glass composition was applied to a sealing of a sheathed heater. FIG. 6 shows a diagrammatic cross sectional view of a typical sheathed heater, which comprises a U-shaped heat resisting pipe 30 made of stainless steel, magnesium oxide powder 31 filled in the heat resisting pipe and a heater wire 32 placed in the magnesium powder and terminals 33 made of stainless steel connected to the heater wire 32. The ends of the heat resisting pipe are air-tightly sealed with a sealing material 34.

At first, magnesium powder 31 and the heater wire having the terminals are put in the heat resisting pipe, and the heat resisting pipe with the magnesium oxide powder and heater wire was subjected to heating to de-water the magnesium powder in a reducing atmosphere. The sealing material was formed into pellets in advance. The pellets were inserted into the both ends of the heat resisting pipe, and the pellets were heated to air-tightly seal the ends of the heat resisting pipe. A thermal expansion coefficient of the pellets was controlled to around 110 to $130 \times 10^{-7}/°$ C. in consideration of the thermal expansion coefficient of stainless steel. Accordingly, an amount of the filler was controlled to 25% by volume. If the amount of the filler exceeds 25% by volume, the thermal expansion coefficient becomes too small so that satisfactory airtight sealing is difficult to obtain.

A mixture comprising No 24 glass composition in an amount of 80% by volume and alumina powder in an amount of 20% by volume was formed into pellets. The pellets were inserted into both ends of the heat resisting pipe of the sheathed heater. The heater was heated at 480° C. for 10 minutes to sinter the pellets to air-tightly seal the heat resisting pipe. The sheathed heater did not show any problem. After 50 days continuous heating test at 100° C., the heat resisting pipe and terminals did not make short-circuited or the sealed portion did not break.

Example 10

Using the three kinds of silver wiring pastes tested in example 7, plasma display panels shown in FIG. 5 were prepared in the same manner as in example 8. The three kinds of silver electrode wiring pastes comprise a mixture of Ag globular silver powder and Ag flake powder in an amount of 90% by weight and No. 68 glass composition, No. 71 glass composition or No. 73 glass composition in an amount of 10% by volume, respectively. A resin binder was ethyl cellulose and a solvent was diethylene glycol monobutyl ether acetate. A photo-sensitizer was added to the pastes.

The electrode wiring pastes were coated on entire surfaces of the front side plate 10 and rear side plate 11 and dried. Photo-masks were placed on the plates and irradiated with ultraviolet ray to develop patterns. By removing unwanted portions, display electrodes 18 and address electrodes 19 were formed. Thereafter, the patterns were sintered at 500° C. for 30 minutes. Then, black matrix 21 and dielectric layers 22, 23 were formed at 500 to 600° C. to prepare plasma display panels in the same manner as in example 9. Sealing of the front side plate 10 and the rear side plate 11 was done with No. 71 glass composition. The sealing composition comprised No. 71 glass composition in an amount of 70% by volume, cordierite powder in an amount of 20% by volume, alumina in an amount of 10% by volume, a resin binder (ethyl cellulose) and a solvent (diethylene glycol monobutyl ether acetate).

The plasma display panes that used the three kinds of silver electrode wiring pastes could be prepared without any problems. Accordingly, the silver electrode wiring can be applied to display electrodes 18 and address electrodes 19 of the plasma display panels. The glass compositions of the present invention are effectively used for silver thick film wiring.

Example 11

Figure 7:
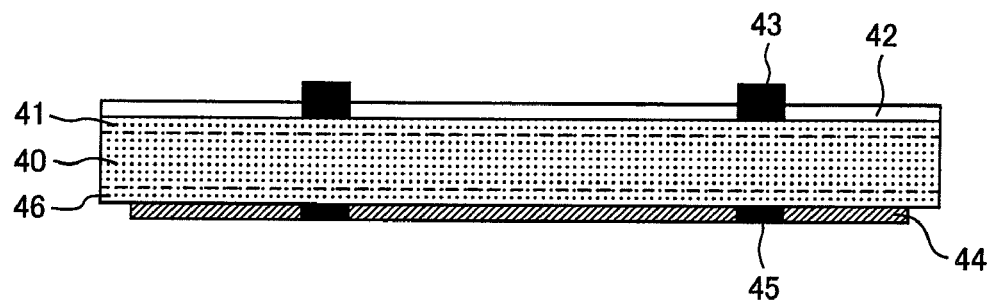
FIG. 7 is a cross sectional view of a typical solar cell element to which the present invention is applied.
Figure 8:
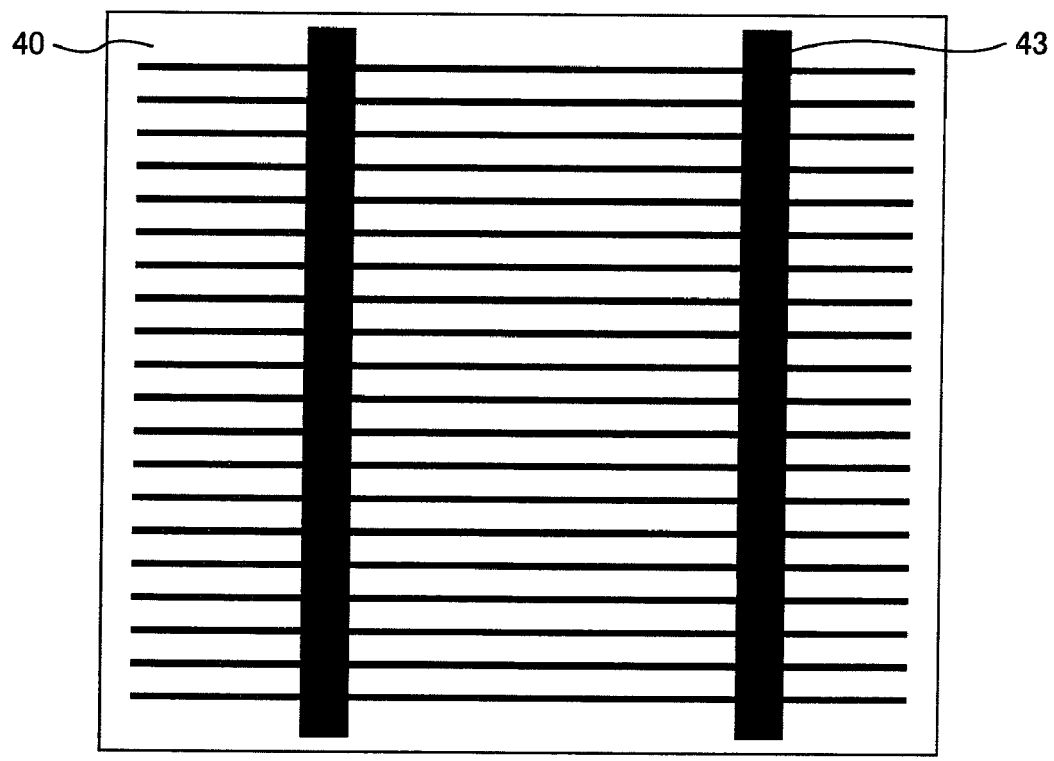
FIG. 8 is a plan view of the solar cell shown in FIG. 7.
Figure 9:
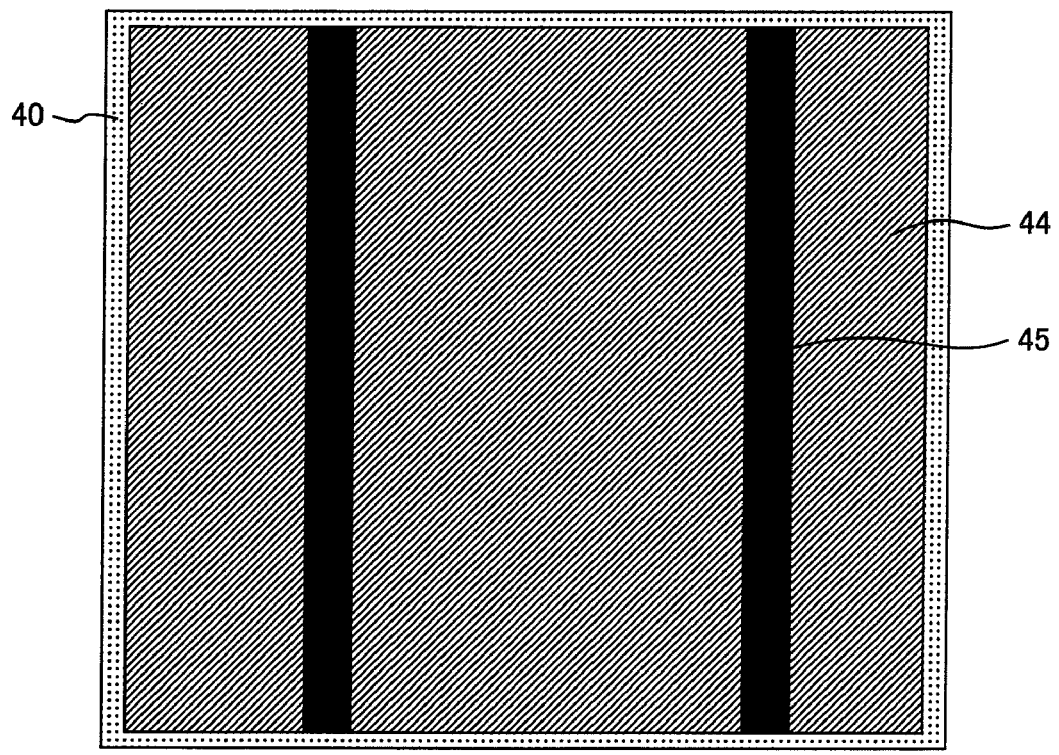
FIG. 9 is a plan view of another solar cell to which the present invention is applied.

In this example, the glass composition was applied to electrodes of solar cells. A typical solar cell is shown in FIGS. 7, 8 and 9 wherein FIG. 7 is a cross sectional view, FIG. 8 shows a plan view of a top face the panel and FIG. 9 shows a plane view of a rear face of the panel shown in FIG. 8.

In general, a semiconductor substrate 40 of the solar cell is made of single crystal silicon or polycrystal silicon. The semiconductor substrate 40 is doped with boron to make it into p-type semiconductor. A light receiving face of the semiconductor substrate has an uneven face formed by etching to suppress reflection of solar light therefrom. Phosphor, etc is doped in the surface of the semiconductor substrate to form an n-type semiconductor diffusion layer 41 in a thickness of submicron order, and a pn junction is formed with the p-type bulk. Further, an anti-reflection film (reflection preventing film) 42 of silicon nitride, etc is formed on the light receiving face by vacuum evaporation method, etc in a thickness of around 100 nm.

Formation of light receiving electrodes 43, a collector electrode 44 on the rear face and power output electrodes 45 will be explained in the following. Normally, silver paste containing glass composition powder is used for the light receiving electrodes and power output electrodes, and aluminum electrode paste containing the glass composition powder is used for the collector electrodes. The pastes are coated by a screen printing method. After drying the coating, the coating is sintered at around 800° C. to form the electrodes. At the time of sintering, the glass composition reacts with the anti-reflection film 42 in the light receiving face to electrically connect the light receiving electrodes 43 and the diffusion layer 41. In the rear face, aluminum in the collector electrodes 44 diffuses into the rear face f the semiconductor substrate 40 to form electrode ingredient diffusion layer 46 to thereby form ohmic contacts among the semiconductor substrate 40, the collector electrodes 44 and the power output electrodes 45.

Using No. 71 glass composition in Table 3, silver pastes for light receiving electrodes 43 and power output electrodes 45 were prepared, and aluminum electrode paste for the collector electrode was prepared. Each of the pastes comprised No. 71 glass composition powder in an amount of 10% by volume, silver or aluminum powder in an amount of 90% by volume, a resin binder (ethyl cellulose) and a solvent (diethylene glycol monobutyl ether acetate). An average particle size of No. 71 glass composition powder was about 1 μm. Silver and aluminum powder were flake powders, which were prepared by mechanically collapsing globular powder having a particle size of about 1 to 3 μm. The pastes had a viscosity suitable for a screen printing method.

The aluminum electrode paste for the collector electrode 44 was coated on the rear face of the semiconductor substrate 40 by a screen printing method as shown in FIGS. 7 and 9. The coating was dried, and rapidly heated with an ultra red ray furnace at 550° C. Then, the substrate was rapidly cooled. The holding time at 550° C. was 3 minutes. According to the above process, the collector electrodes 44 were formed in the rear face.

The aluminum electrode paste was coated by a screen printing method on the light receiving face of the semiconductor substrate 40, which is provided with the diffusion layer 41 and anti-reflection layer 42 and on the rear face of the semiconductor substrate, which is provided with the collector electrode 44 as shown in FIGS. 7, 8 and 9. The coating was dried, rapidly heated at 700° C. with an ultra red ray furnace and rapidly cooled. Holding time at 700° C. was 1 minute.

The resulting solar cells had electrical connections between the semiconductor substrate having the light receiving electrodes 43 and the diffusion layer 41 and the electrodes in the light receiving face, and an electrode ingredient diffusion layer 46 was formed in the rear face so that ohmic contacts between the semiconductor substrate 40 and the collector electrodes 44 and between the semiconductor substrate 40 and the power output electrodes 45 were formed.

High temperature high humidity tests at 85° C. in 85% humidity were conducted for 100 hours. As a result, an increase in resistivity of the electrodes and in contact resistance was not observed.

Nos. 62, 67, 73 and 75 glass compositions were used to prepare the solar cells to evaluate them. The results were the same as those of No. 71 glass composition. Accordingly, the glass compositions of the present invention can be applied to solar cells.

What is claimed is:

1. A glass composition being substantially free from lead and bismuth and containing phosphor oxide and up to 45% by weight of $V_2O_5$ as main components and manganese oxide and barium oxide, wherein a sintered glass obtained by sintering the glass composition exhibits a resistivity of $10^9$ Ωcm or more at 25° C.

2. The glass composition according to claim 1, wherein the glass composition further comprises at least one of oxides of alkali metals, antimony, tellurium, zinc, silicon, aluminum, niobium and rare earth elements.

3. The glass composition according to claim 1, wherein the glass composition further comprises at least one of oxides of alkali metals, antimony, tellurium, zinc, silicon, aluminum, niobium, rare earth elements, iron, tungsten and molybdenum.

4. The glass composition according to claim 1, wherein the sintered glass of the glass composition exhibits a resistivity of $10^{10}$ Ωcm or more and softening point is 500° C. or lower.

5. The glass composition according to claim 1, wherein the glass composition comprises from 33 to less than 45% by weight of $V_2O_5$ and 22 to 30% by weight of $P_2O_5$.

6. The glass composition according to claim 1, wherein the glass composition comprises less than 45% by weight of $V_2O_5$.

7. The glass composition according to claim 1, wherein the glass composition is free from lead and bismuth.

8. The glass composition according to claim 1, which further comprises at least one of a filler powder, a pigment powder and metal powder.

9. The glass composition according to claim 1, further comprising a filler powder.

10. The glass composition according to claim 9, wherein an amount of the filler powder is 40% by volume or less.

11. The glass composition according to claim 9, wherein an average particle size of the filler powder is 12 to 40 μm.

12. A sealing body, which comprises a sintered glass composition of claim 9, the sintered glass composition having resistivity of $10^{10}$ Ωcm or more at 25° C.

13. The glass composition according to claim 1, wherein the glass composition further contains an oxide of an alkali metal.

14. The glass composition according to claim 13, wherein the glass composition comprises 33-45% by weight of $V_2O_5$.

15. The glass composition according to claim 13, wherein the glass composition comprises from 33 to less than 45% by weight of $V_2O_5$ and 22 to 30% by weight of $P_2O_5$.

16. The glass composition according to claim 13, wherein the glass composition comprises less than 45% by weight of $V_2O_5$.

17. A wiring material comprising the glass composition according to claim 13, a filler powder and metal powder.

18. A wiring material comprising a metal powder and a glass composition powder defined in claim 1.

19. The wiring material according to claim 18, wherein an amount of the glass composition powder is 10 to 40% by volume and an amount of the metal powder is 60 to 90% by volume.

20. The wiring material according to claim 18, which further comprises a filler powder in an amount of 10 to 40% by volume and the metal powder in an amount of 60 to 90% by volume.

21. The wiring material according to claim 18, wherein the metal powder is silver powder or copper powder.

22. The wiring material according to claim 18, wherein the metal powder is at least one of silver powder, copper powder and aluminum powder.

23. A structural material comprising the glass composition defined in claim 1, and a filler powder, wherein the glass composition is in an amount of 30 to 60% by volume and the filler powder is in an amount of 40 to 70% by volume.

24. An optical black material comprising the glass composition defined in claim 1 and a black material.

25. The optical black material according to claim 24, which further comprises a filler powder in an amount of 40% by volume or less.

26. The optical black material according to claim 24, wherein an amount of the black material is 30% by volume.

27. A glass paste comprising the glass composition defined in claim 1, a resin binder and a solvent.

28. A display device comprising a front side plate carrying an electrode, a rear side plate carrying an electrode and opposed to the front side plate to form a space therebetween, means for applying to the electrodes, and a sealing portion for air tightly sealing the peripheries of the front side plate and rear side plate, wherein the sealing portion is in contact with at least part of the electrodes, and wherein the sealing portion is a sintered glass composition defined in claim 1 in an amount of 60 to 85% by volume and a filler in an amount of 15 to 40% by volume.

29. A sheathed heater comprising a heat resisting pipe, a refractory powder filled in the pipe, a wire heater buried in the refractory powder, terminals connected to each end of the heater wire, and sealing portions for air-tightly sealing each end of the pipe, wherein the sealing portions are made of a sintered glass of the glass composition defined in claim 1.

30. The sheathed heater according to claim 29, wherein the sealing portions contain a filler in an amount of 75% by volume or more and an amount of the filler is in an amount of 25% by volume or less.

31. A display device comprising a front side plate carrying an electrode containing silver, a rear side plate carrying an electrode containing silver and opposed to the front side plate to form a space therebetween, and a sealing portion for air tightly sealing the peripheries of the front side plate and rear side plate, wherein the sealing portion is in contact with at least part of the electrodes, and wherein the electrodes is a sintered glass comprising the glass composition defined in claim 1 and silver.

32. A solar cell comprising a semiconductor substrate having p-type region and n-type region to constitute a pn-junction and a light receiving face and a rear face; a light receiving electrode formed in the light receiving face; an anti-reflection film formed on the light receiving face; and a rear electrode formed on the rear face, wherein the light receiving electrode is a sintered body comprising silver and the glass composition defined in claim 1.

33. A solar cell comprising a semiconductor substrate having p-type region and n-type region to constitute a pn-junction and a light receiving face and a rear face; a light receiving electrode formed in the light receiving face; an anti-reflection film formed on the light receiving face; and a rear electrode formed on the rear face, wherein the rear electrode comprises a collector electrode and power output electrode, the collector electrode comprising aluminum and a glass composition and the power output electrode comprising silver and a glass composition, the glass composition being one defined in claim 1.

34. A glass composition being substantially free from lead and bismuth, wherein a sintered glass obtained by sintering the glass composition exhibits a resistivity of $10\,\Omega\text{cm}$ or more at $25°$ C., which comprises, based on conversions of oxides, 33 to 45% by weight of $V_2O_5$, 22 to 30% by weight of $P_2O_5$, 5 to 15% by weight of MnO, 10 to 20% by weight of BaO, 0 to 8% by weight of $R_{2O}$ where R is alkali metals, and 0 to 10% by weight in a total amount of at least one of $Sb_2O_3$, $TeO_2$, ZnO, $SiO_2$, $Al_2O_3$, $Nb_2O_5$ and $La_2O_3$.

35. The glass composition according to claim 34, wherein the glass composition is free from lead and bismuth.

36. The glass composition being substantially free from lead and bismuth, wherein a sintered glass obtained by sintering the glass composition exhibits a resistivity of $10^9\,\Omega\text{cm}$ or more at $25°$ C., which comprises, based on conversions of oxides, 30 to 45% by weight of $V_2O_5$, 22 to 30% by weight of $P_2O_5$, 5 to 15% by weight of MnO, 5 to 20% by weight of BaO, 0 to 8% by weight of $R_{2O}$ where R is alkali metals, and 0 to 25% by weight in a total amount of at least one of $Sb_2O_3$, $TeO_2$, ZnO, $SiO_2$, $Al_2O_3$, $Nb_2O_5$, $La_2O_3$, $Fe_2O_3$, $WO_3$ and $MoO_3$.

37. The glass composition according to claim 36, wherein the glass composition is free from lead and bismuth.

* * * * *